April 29, 1969 C. M. BODINE 3,441,853

PLUG-IN INTEGRATED CIRCUIT PACKAGE AND CARRIER ASSEMBLY AND INCLUDING A TEST FIXTURE THEREFOR

Filed June 21, 1966

INVENTOR.

Charles M. Bodine

BY

Flehr & Swain

Attorneys

United States Patent Office 3,441,853

Patented Apr. 29, 1969

3,441,853

PLUG-IN INTEGRATED CIRCUIT PACKAGE AND CARRIER ASSEMBLY AND INCLUDING A TEST FIXTURE THEREFOR

Charles M. Bodine, Los Altos, Calif., assignor to Signetics Corporation, Sunnyvale, Calif., a corporation of California Filed June 21, 1966, Ser. No. 559,162
Int. Cl. G01r 35/00
U.S. Cl. 324—158 5 Claims

ABSTRACT OF THE DISCLOSURE

The assembly consists of an integrated package and a carrier enclosing the package. The circuit package comprises a body having a plurality of leads extending outwardly from two sides of the body and downwardly in substantially parallel relationship. The carrier comprises four interconnected side walls forming a rectangle, two opposed side walls having slots therein for frictionally engaging the leads of the circuit package and shoulder means forming a termination for said slots. A mating test fixture is also provided for testing the circuit package while it remains within the carrier.

This invention relates to a carrier for a plug-in integrated circuit package and an assembly thereof.

In the shipment of integrated circuits, particularly integrated circuits mounted in plug-in packages, there is a necessity for protecting the leads during shipment. There is, therefore, a need for a carrier for plug-in integrated circuit packages.

In general, it is an object of the present invention to provide a carrier for plug-in integrated circuit packages to prevent the integrated circuit packages from being damaged in shipment.

Another object of the invention is to provide a carrier of the above character in which the integrated circuit package can be readily inserted and removed.

Another object of the invention is to provide a carrier of the above character in which the integrated circuit package can be readily mounted.

Another object of the invention is to provide a carrier of the above character in which the integrated circuit package can be readily removed from the carrier.

Another object of the invention is to provide an integrated circuit package of the above character in which the leads of the integrated circuit package are completely within the carrier when the package is disposed within the carrier.

Another object of the invention is to provide a carrier of the above character which can be readily and inexpensively manufactured.

Another object of the invention is to provide a carrier of the above character which can be utilized in conjunction with automatic feeders.

Another object of the invention is to provide a carrier of the above character which is formed to permit visual orientation of the carrier.

Another object of the invention is to provide a carrier of the above character in which the package in the carrier can be tested while it is in the carrier.

Additional objects and features of the invention will appear from the following description in which the preferred embodiment is set forth in detail in conjunction with the accompanying drawings.

Referring to the drawings.

Figures 1, 2, 3, 4, 5, 6:
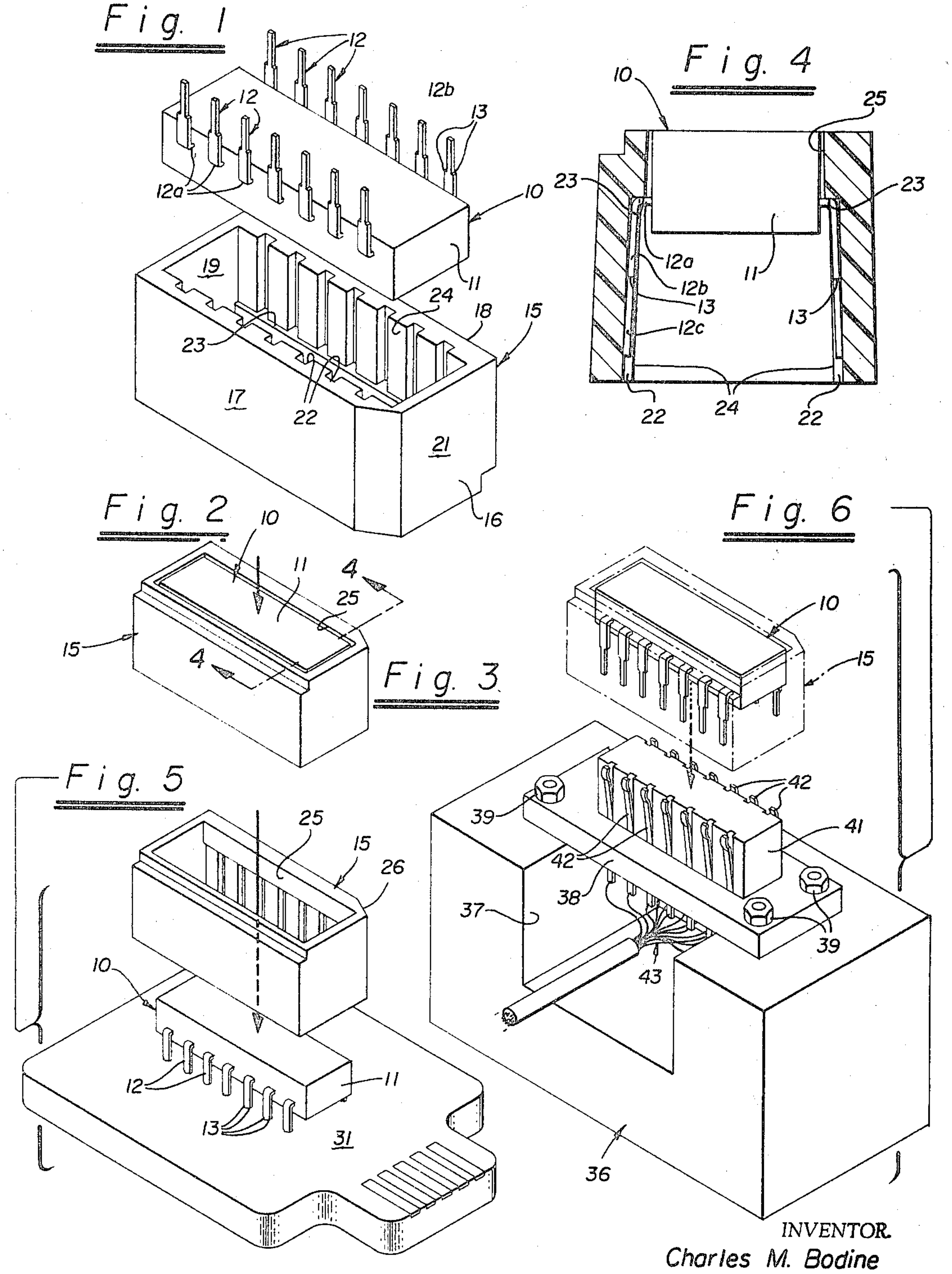
FIGURE 1 is an isometric view of an integrated circuit package of the plug-in type.
FIGURE 2 is an isometric view of the carrier for the plug-in integrated circuit package shown in FIGURE 1.
FIGURE 3 is an isometric view showing an assembly of the integrated circuit package shown in FIGURE 1 and the carrier shown in FIGURE 2.
FIGURE 4 is an enlarged cross-sectional view taken along the line 4—4 of FIGURE 3.
FIGURE 5 is an isometric view showing the manner for mounting an integrated circuit package on a printed circuit board when the package is carried by a carrier of the present invention.
FIGURE 6 is an isometric view of a test block for testing the integrated circuit package when it is in the carrier.

In general, the assembly consists of a package and a carrier enclosing the package. The package for integrated circuits consists of a body having at least one integrated circuit mounted therein and with a plurality of leads connected to the integrated circuit and extending outwardly from the body and downwardly from the body from at least two sides. The carrier consists of four interconnected side wal's with an open bottom end and top end. The side walls are formed with spaced recesses which accommodate the leads of the package and frictionally engage the leads so that the carrier is retained on the package.

More in particular, as shown in the drawings, the plug-in integrated circuit package 10 is of a conventional type and consists of a body 11 which is formed of a suitable material such as an epoxy. As can be seen from FIGURE 1, the body is in the form of a rectangular block. Encapsulated within the body is at least one integrated circuit (not shown) of a type which generally includes a plurality of active elements and passive elements of types which are well known to those skilled in the art. A typical integrated circuit sold in such a configuration is one identified as Signetics Corporation Model No. SP 600. A plurality of leads 12 of a conducting material are also mounted in the body 11 and are connected to the various portions of the integrated circuitry so that contact to the integrated circuitry can be made solely through the leads 12. By way of example, the body 11 can be ¼ of an inch wide, ⅛ of an inch thick or high, and ¾ inch long.

The leads 12 are relatively narrow and flat but are of a sufficient thickness so that they are relatively rigid. The leads 12 have portions **12*a* which extend outwardly a short distance from the wide sides of the body 11 and portions 12*b* and narrower portions 12*c* which depend downwardly from the portions 12*a* in two substantially vertical spaced parallel rows to permit same to be plugged into printed circuit boards having holes appropriately spaced to match the lead spacing on the package. Each of the leads 12 is provided with a shoulder 13 formed on each side of each of the leads between the portions 12*b* and 12*c*** for a purpose hereinafter described.

The carrier 15, as shown in FIGURE 2, consists of a four-sided enclosure 16 formed by spaced parallel long side walls 17 and 18 and spaced parallel short end walls 19 and 21 which are interconnected to form the four-sided enclosure. The carrier is formed of a suitable material, as for example, acrylic plastic, and can be formed in a suitable manner such as by injection molding. The inner and outer surfaces of the side walls 17 and 18 and the end walls 19 and 21 are substantially planar and parallel. However, as can be seen from FIGURE 4, the side walls 17 and 18 are inclined slightly in a downward and outward direction. The inner surfaces of the side walls 17 and 18 are formed with a plurality of spaced parallel, substantially vertical, inwardly facing slots or recesses 22. The slots 22 are inclined slightly downwardly and outwardly from the vertical and are sized and spaced so that they can accommodate the spaced parallel leads 12 provided on the package 10. Thus, slots 22 have a depth and width which is substantially identical to the thickness and width of the leads 12 as can be seen particularly from FIGURE 4. The slots 22 extend from the bottom side of the side walls 17 and 18 to the upper portion of each of the side walls 17 and 18 so that shoulders 23 are formed in the enclosure 16 which are adapted to be engaged by the outwardly extending portions 12*a* of the leads 12 as shown particularly in FIGURE 4. As can be seen from FIGURES 2 and 4, the bottom side of the enclosure 16 has an opening 24 so that the package may be inserted from the bottom side. In addition, the top side of the enclosure is provided with an opening 25. It is not necessary that the top side of the enclosure 16 be open. However, in order to facilitate removal of the package from the carrier, it is preferable that the top have an opening of a sufficient size to permit a tool to be inserted therethrough to push the package out of the carrier.

In order to facilitate machine sorting, the enclosure 16 is provided with a chamfered corner 26 and an elongate recess 27 opposite the side on which the chamfer is formed extending longitudinally of the enclosure 16.

In utilizing the carrier 15, the package 10 is either positioned mechanically or by hand into the carrier. This is accomplished by urging the upper side of the package 10 upwardly through the bottom opening 24 of the carrier and moving the same upwardly into the carrier with leads 12 in registration with the slots 22 formed in the side walls 17 and 18. The package 10 is pushed into the carrier 15 until the portions 12*a* of the leads 12 of the package engage the shoulders 23 of the carrier. It will be noted that when the package is in this position, the upper surface of the body 11 is approximately flush with the upper surface of the carrier to give an attractive appearance to the assembly as shown in FIGURES 3 and 4. The package is yieldably retained in the carrier by the frictional engagement between the leads 12 disposed in the slots 22 in the carrier. In order to ensure such retention, the slots 22 are inclined from the vertical slightly less than the portions 12*b* and 12*c* of the leads 12 to thereby increase the frictional engagement between the same.

After the package has been loaded into the carrier in the manner described, the package containing the integrated circuit can be handled mechanically if desired without any danger of the leads from the package becoming tangled with each other or without any danger of the leads of the package becoming bent or destroyed. The package can be readily transported within the carrier until it is received by the customer. The chamfer on the corner permits the customer to visually inspect the package and to properly position it on the printed circuit board. Alternatively, the assembly of the carrier and the package can be handled by machines because of the orientation slot 27 provided in the carrier. The carrier 15 permits the packages to be handled in bulk without any danger of the leads 12 becoming tangled.

As soon as the package has been properly oriented on the printed circuit board, the portions 12*a* of the leads 12 can be pushed through the holes in the printed circuit board 31 as shown in FIGURE 5 by depressing downwardly upon the package 10 and at the same time lifting the carrier 15 upwardly. The narrow portions 12*a* are pushed through the holes in the printed circuit board until the shoulders 13 engage the printed circuit board 31. The shoulders 13 ensure that the package seats firmly on the printed circuit board and is still spaced above the printed circuit board to permit cleaning of the boards after soldering, etc.

After the carrier 15 has been removed, it can either be re-used or it can be destroyed. Destruction is feaseible because the carrier can be manufactured and sold very inexpensively. In order to facilitate the removal of the carrier from the package, it may be desirable to utilize an ejection tool which is moved through the top opening 25 of the carrier 15.

Means can be provided for testing the integrated circuitry in the package 10 before it is removed from the carrier 15. As can be seen from FIGURE 6, such means consists of a test block 36 which is provided with a rectangular recess 37. A plate 38 of suitable insulating material is mounted upon the block 36 by screws 39. An additional smaller block 41 is mounted upon the plate 38 and has secured thereto a plurality of spaced parallel spring-like contact fingers 42 which are arranged in two spaced parallel rows and are dimensioned so that they are adapted to engage the inner surfaces of the leads 12 of a package when the package 10 is moved downwardly over the block 41 as shown in FIGURE 6. The contact fingers 42 are connected to leads 43 which are connected to appropriate test circuitry (not shown) for checking out the integrated circuitry contained in the package 10. As can be seen from FIGURE 6, the integrated circuit package 10 can be readily positioned on the contact fingers 42 to make a rapid check-out of the integrated circuitry contained in the package 10. Thus, it can be seen that the package 10 can be tested without removing the same from the carrier. If the package tests out satisfactorily, the package can then be mounted in a printed circuit in the manner hereinbefore described.

It is apparent that there has been provided an assembly consisting of a package and carrier in which the carrier protects the package and permits the same to be handled in bulk without endangering the leads of the integrated circuit packages. In addition, the arrangement is such that the package can be tested before it is removed from the carrier.

I claim:

1. In an assembly of the character described, a package consisting of a rectangular body formed of an insulating material, said body having a plurality of spaced leads extending from the sides of the body having outwardly extending portions and portions depending downwardly from the outwardly extending portions, said downwardly depending portions being free of the body and forming two substantially parallel rows and a carrier for said package and consisting of a rectangular enclosure formed by spaced substantially parallel side walls, spaced substantially parallel end walls and a bottom opening, the spaced side walls being formed with a plurality of spaced inwardly facing parallel slots or recesses therein having a depth and width which is substantially identical to the thickness and width of the leads, said slots terminating short of the upper margin of the carrier to form shoulders, the outwardly extending portions of the leads of the package engaging the shoulders to limit the movement of the package in one direction within the carrier, the length of the slots being such that the leads are completely disposed within the carrier.

2. An assembly as in claim 1 wherein the leads frictionally engage the slots in the carrier, the frictional engagement between the leads and the slots forming the sole means for preventing movement of the package in the opposite direction within the carrier.

3. An assembly as in claim 1 wherein said carrier is formed with a recess in the outer surface thereof to permit machine sorting of the same.

4. An assembly as in claim 1 wherein said slots are free of a conducting material.

5. In an assembly of the character described, a package consisting of a rectangular body formed of an insulating material, said body having a plurality of spaced leads extending from the sides of the body having outwardly extending portions and portions depending downwardly from the outwardly extending portions, said downwardly depending portions forming two substantially parallel rows, a carrier for said package and consisting of a rectangular enclosure formed by spaced substantially parallel side walls, spaced substantially parallel end walls and a bottom opening, the spaced side walls being formed with a plurality of spaced inwardly facing parallel slots or recesses therein having a depth and width which is substantially identical to the thickness and width of the leads, said slots terminating short of the upper margin of the carrier to form shoulders, the outwardly extending portions of the leads of the package engaging the shoulders to limit the movement of the package in one direction within the carrier, the length of the slots being such that the leads are completely disposed within the carrier, and a test fixture, said fixture comprising a block, spring contact fingers mounted on said block and being spaced in two parallel rows to correspond to the two parallel rows of leads of the package, said test fixture being dimensioned so that the package while mounted in the carrier can be positioned on the test fixture with the leads in registration with the fingers to permit testing of the package while still in the carrier.

References Cited

UNITED STATES PATENTS

| | | | |
|---|---|---|---|
| 3,203,123 | 8/1965 | Dominy | 206—73 XR |
| 3,264,525 | 8/1966 | Swengel | 317—101 |
| 3,289,045 | 11/1966 | Pritikin | 317—101 |

RUDOLPH V. ROLINEC, *Primary Examiner.*

E. L. STOLARUN, *Assistant Examiner.*

U.S. Cl. X.R.

174—52; 206—46; 317—101; 339—17, 36